(12) United States Patent
Kim et al.

(10) Patent No.: US 8,563,903 B2
(45) Date of Patent: Oct. 22, 2013

(54) METHOD AND CIRCUIT FOR CONTROLLING RADIANT HEAT OF TRANSISTOR USING METAL-INSULATOR TRANSITION DEVICE

(75) Inventors: Hyun-Tak Kim, Daejeon (KR); Yong-Wook Lee, Daejeon (KR); Bong-Jun Kim, Daejeon (KR); Sun-Jin Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 590 days.

(21) Appl. No.: 12/742,430

(22) PCT Filed: Nov. 11, 2008

(86) PCT No.: PCT/KR2008/006630
§ 371 (c)(1),
(2), (4) Date: Oct. 1, 2010

(87) PCT Pub. No.: WO2009/064098
PCT Pub. Date: May 22, 2009

(65) Prior Publication Data
US 2011/0018607 A1    Jan. 27, 2011

(30) Foreign Application Priority Data

| Nov. 12, 2007 | (KR) | 10-2007-0114962 |
| May 7, 2008 | (KR) | 10-2008-0042489 |
| Jun. 3, 2008 | (KR) | 10-2008-0052257 |

(51) Int. Cl.
*H05B 1/02* (2006.01)

(52) U.S. Cl.
USPC ........... 219/494; 219/501; 219/505; 327/512; 257/467; 361/717

(58) Field of Classification Search
CPC .................. H05B 1/02; H05B 2203/022
USPC ............ 219/494, 501, 502, 505; 327/512; 257/252, 255, 414, 467, 469, 470; 361/714, 717
See application file for complete search history.

(56) References Cited

U.S. PATENT DOCUMENTS

| 5,389,813 A | * | 2/1995 | Schwob | 257/469 |
| 5,497,285 A | * | 3/1996 | Nadd | 361/103 |
| 5,763,929 A | * | 6/1998 | Iwata | 257/467 |

FOREIGN PATENT DOCUMENTS

| JP | 01-233702 A | 9/1989 |
| JP | 5-004512 U | 1/1993 |

(Continued)

*Primary Examiner* — Mark Paschall
(74) *Attorney, Agent, or Firm* — Rabin & Berdo, P.C.

(57) ABSTRACT

Provided are a method and circuit for controlling heat generation of a power transistor, in which the power transistor can be protected by preventing heat generation of the power transistor by using a metal-insulator transition (MIT) device that can function as a fuse and can be semi-permanently used. The circuit for controlling heat generation of a transistor includes a metal-insulator transition (MIT) device in which abrupt MIT occurs at a predetermined critical temperature; and a power transistor connected to a driving device and controlling power-supply to the driving device, wherein the MIT device is attached to a surface or heating portion of the transistor and is connected to a base terminal or gate terminal of the transistor or a surrounding circuit from a circuit point of view, and wherein when a temperature of the transistor increases to a temperature equal to or greater than the predetermined critical temperature, the MIT device reduces or shuts off a current of the transistor so as to prevent heat generation of the transistor.

34 Claims, 11 Drawing Sheets

(56) References Cited

FOREIGN PATENT DOCUMENTS

| | | |
|---|---|---|
| JP | 6-058821 A | 3/1994 |
| JP | 07-245375 A | 9/1995 |
| JP | 2003-046056 A | 2/2003 |
| JP | 2004-168560 A | 6/2004 |
| JP | 2006-030327 A | 2/2006 |
| JP | 2006-032898 A | 2/2006 |
| KR | 2005-0043431 A | 5/2005 |
| KR | 2006-0093266 A | 8/2006 |

* cited by examiner

METHOD AND CIRCUIT FOR CONTROLLING RADIANT HEAT OF TRANSISTOR USING METAL-INSULATOR TRANSITION DEVICE

TECHNICAL FIELD

The present invention relates to a metal-insulator transition (MIT) device, and more particularly, to a method and circuit for controlling heat generation of a power transistor using an MIT device.

BACKGROUND ART

Power transistors for controlling power have been widely used in industrial devices including computers. Since power transistors supply power, they generate a large amount of heat. Generally, a fuse is connected to a base or gate of a power transistor in order to protect the power transistor.

The fuse breaks when the temperature thereof reaches a predetermined dangerous temperature, thereby turning-off and cooling the transistor so as to protect it. An inexpensive fuse is used in expensive equipment so that a system including the equipment can be protected by checking whether the fuse is cut. However, a problem occurs when changing/replacing the fuse.

When changing/replacing the fuse, although the fuse is inexpensive, it take a certain amount of time and costs are incurred when hanging/replacing the fuse, and economic loss may be caused since equipment cannot be used during changing/replacing the fuse. Accordingly, research has been conducted on a device that can function as a fuse and can be continually used without needing to be changed/replaced and on a method and circuit for controlling radiant heat of transistor using the device.

Currently, when a secondary cell is charged, a power transistor through which a current of at least 500 mA can flow is required. In this case, a temperature of the power transistor (TIP 29C and a maximum current of 2 A) can be increased to a temperature equal to or greater than 100° C., for example, 140° C. Thus, a temperature fuse is used to protect a power system, and an aluminum heat sink is used to cool heat generation by the power system.

Power transistors use an aluminum heat sink to prevent heat generation. In this regard, since the size of a heat sink is greater than that of a transistor, the heat sink occupies a large space in a power system, which is an obstacle to miniaturization of such power systems. In addition, since radiant heat of a transistor is waste thermal energy converted from electrical energy, problems regarding radiant heat should be overcome to improve energy efficiency.

DISCLOSURE OF INVENTION

Technical Problem

The present invention provides a method and circuit for controlling radiant heat of a transistor, in which a power transistor can be protected by preventing heat generation of the power transistor by using a metal-insulator transition (MIT) device that can function as a fuse and can be semi-permanently used.

Technical Solution

According to an aspect of the present invention, there is provided a circuit for controlling heat generation of a transistor, the circuit comprising a metal-insulator transition (MIT) device in which abrupt MIT occurs at a predetermined critical temperature; and a power transistor connected to a driving device and controlling power-supply to the driving device, wherein the MIT device is attached to a surface or heating portion of the transistor and is connected to a base terminal or gate terminal of the transistor or a surrounding circuit from a circuit point of view, and wherein when a temperature of the transistor increases to a temperature equal to or greater than the predetermined critical temperature, the MIT device reduces or shuts off a current of the transistor so as to prevent heat generation of the transistor.

The translator may be an NPN or PNP junction transistor. The translator may be a metal oxide semiconductor (MOS) transistor. The translator may comprise any one of a photo diode, photo relay and photo silicon controlled rectifier (SCR) using light input to the base terminal. The transistor may comprise any one of an insulated gate bipolar transistor (IGBT), an SCR and a triac.

The MIT device may comprise an MIT thin film where abrupt MIT occurs at the critical temperature; and at least two electrode thin films in contact with the MIT thin film. The MIT device may be a stack type in which the at least two electrode thin films are disposed between the MIT thin film, or a horizontal type in which the at least two electrode thin films disposed at both sides of the MIT thin film. The MIT device may be packaged in a dual in-line package (DIP) type in which the MIT thin film and the at least two electrode thin films are sealed by a sealing member, or is packaged in a CAN type in which a predetermined portion of the MIT thin film is exposed. The MIT device may be manufactured of a thin film, ceramic or a single crystal.

The MIT device may be a DIP type MIT device, wherein the DIP type MIT device may include two external electrodes connected to the at least two electrode thin films and an external heating terminal detecting heat generation of the driving device and connected to the MIT thin film. The MIT device may be a CAN type MIT device, wherein the CAN type MIT device includes two external electrode terminals connected to the at least two electrode thin films and detects heat generation of the driving device through infrared rays (i.e., heat rays) input through the predetermined portion that is exposed.

According to another aspect of the present invention, there is provided a circuit for controlling heat generation of a transistor, the circuit comprising an MIT device in which abrupt MIT occurs at a predetermined critical temperature; and two power transistors connected to both sides of a driving device and controlling power-supply to the driving device, wherein the MIT device is attached to a surface or heating portion of at least one of the two power transistors and is connected to a base terminal or gate terminal of each of the two power transistors from a circuit point of view, and wherein when a temperature of a first transistor of the two power transistors increases to a temperature equal to or greater than the predetermined critical temperature, the MIT device shuts off a current of the first transistor and allows a current to flow through a second transistor of the two power transistor so as to prevent heat generation of the two power transistors. Alternatively, there is provided a circuit for controlling heat generation of a transistor comprising a power MIT device used instead of the second transistor, and attached to the surface or heating portion of the first transistor, wherein, when a temperature of the first transistor increases to a temperature equal to or greater than the predetermined critical temperature, the power MIT device may compensate a amount of current reduced in the first transistor.

One of the two power transistor may be an NPN junction transistor and the other of the two power transistors is a PNP junction transistor. One of the two power transistors may be an N-type MOS transistor and the other of the two power transistors is a P-type MOs transistor, wherein the N-type and P-type MOS transistors are separately formed or integrated as a complementary metal oxide semiconductor (CMOS) transistor.

A power transistor and an MIT device may be designed as a signal chip, or alternatively, may be integrated into a single package.

According to a voltage applied to the MIT device, the predetermined critical temperature may vary.

According to another aspect of the present invention, there is provided a circuit for controlling heat generation of a transistor, the circuit comprising an MIT device in which abrupt MIT occurs at a predetermined critical temperature; two power transistors connected to both sides of a driving device and controlling power-supply to the driving device; and a transistor (an MIT transistor) for protecting the MIT device, controlling a current of the MIT device and supplying power towards the driving device, wherein the MIT device is attached to a surface or heating portion of at least one of the two power transistors and is connected to a base terminal or gate terminal of each of the two power transistors from a circuit point of view, and wherein when a temperature of the two transistors increases to a temperature equal to or greater than the predetermined critical temperature, the MIT device controls a current supplied to the two transistors so as to control heat generation of the two transistors.

One of the two power transistor may be an NPN junction transistor and the other of the two power transistors is a PNP junction transistor. When a temperature of a first transistor of the two transistors increases to a temperature equal to or greater than the critical temperature, the MIT device may shut or reduce a current of the first transistor and may allow a current to flow through a second transistor of the two power transistor so as to prevent heat generation of the two power transistors, which is a method of compensating a current reduced in the first transistor. In addition, an MIT device may be used instead of the second transistor.

The MIT device may be disposed on the NPN junction transistor or may be commonly disposed on the NPN junction transistor and the PNP transistor.

According to another aspect of the present invention, there is provided a circuit for controlling heat generation of a transistor, the circuit comprising a power transistor connected to a driving device and controlling power-supply to the driving device; a first MIT device connected to a base terminal or gate terminal of the transistor or a surrounding circuit, where abrupt MIT occurs at a predetermined critical temperature; a second MIT device (a power MIT device) connected between a collector terminal and emitter terminal of the transistor, and between a source terminal and drain terminal of the transistor, wherein abrupt MIT occurs at the critical temperature, wherein the first and second MIT devices are attached to a surface or heating portions of the transistor, wherein when a temperature of the transistor increases to the critical temperature, the first and second devices operate so as to control a current supplied to the transistor and prevent heat generation of the transistor.

According to another aspect of the present invention, there is provided an electric-electronic circuit system comprising the circuit for controlling heat generation of a transistor. The electric-electronic circuit system may further comprise a cellular phone, a computer, a cell charger, a motor controller, a power amplifier including audio equipment, a power controlling circuit and power supply of an electric-electronic device and an inner circuit of a integrated functional integrated circuit (IC) including a microprocessor.

According to another aspect of the present invention, there is provided a method of controlling heat generation of power transistor connected to a driving device and controlling power-supply to the driving device, the method comprising attaching an MIT device where abrupt MIT occurs at a predetermined critical temperature to a surface or heating portion of the power transistor, wherein the MIT device is connected to a base terminal or gate terminal of the power transistor, or a surrounding circuit, from a circuit point of view; and preventing heat generation of the power transistor by reducing or shutting off a current of the power transistor when a temperature of the transistor increases to a temperature equal to or greater than the critical temperature.

Two transistors may be connected to both sides of the driving device, and wherein when a first transistor of the two transistors increases to a temperature equal to greater than the critical temperature, the MIT device reduces or shuts off a current of the first transistor and allows a current to flow through a second transistor of the two transistors so as to prevent heat generation of the two transistors.

Advantageous Effects

According to the present invention, in the method and circuit for controlling heat generation of a transistor, an MIT device attached to a power transistor prevents the power transistor from wrongly operating due to an excessive increase in its temperature. Thus, all devices or system to which the power transistor supplies power can be protected.

Accordingly, the circuit for controlling heat generation of a power transistor can be used in all electric-electronic circuit system using a power transistor, such as a cellular phone, a notebook computer, a cell charging circuit, a motor controlling circuit, a power controlling circuit and power supply of a electric-electronic device, a power amplifier including audio equipment, and an inner circuit of a integrated functional integrated circuit (IC).

In addition, since the MIT device can be semi-permanently used without requiring the MIT device to be changed or replaced, the problem with time to replace or costs incurred due to replacement can be overcome.

DESCRIPTION OF DRAWINGS

The above and other features and advantages of the present invention will become more apparent by describing in detail exemplary embodiments thereof with reference to the attached drawings in which.

BEST MODE

Figure 1:
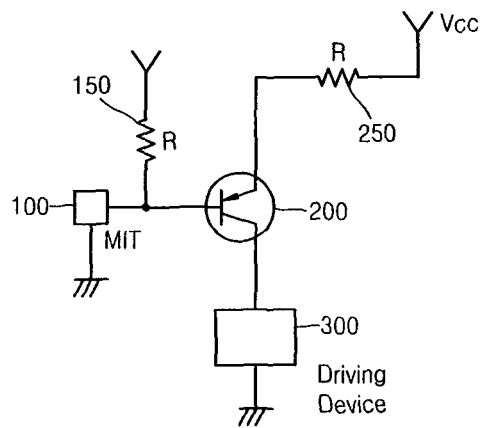
FIG. 1 is a circuit diagram of a circuit of controlling heat generation of power transistor using a metal-insulator transition (MIT) device, according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being 'on' another layer or substrate, it can be directly on the other layer or substrate, or intervening layers may also be present. Like reference numerals in the drawings denote like elements, and thus their description will be omitted.

FIG. 1 is a circuit diagram of a circuit for controlling heat generation of a power transistor using a metal-insulator transition (MIT) device 100, according to an embodiment of the present invention.

Referring to FIG. 1, the circuit for controlling heat generation of a power transistor according to the present embodiment includes a power transistor 200, i.e., a PNP junction transistor, and the MIT device 100. An emitter and a collector of the power transistor 200 are respectively connected to power source Vcc and a driving device 300, and a base of the power transistor 200 is connected to the MIT device 100.

The power transistor 200 controls a large power-supply to the driving device 300. As described in the background of the invention, heat is generated due to a large current, and the power transistor 200 may operate incorrectly due to the heat. When the power transistor 200 wrongly operates, the driving device 300 might be damaged or destroyed.

In order to control the heat generation of the power transistor 200, the circuit for controlling heat generation of a power transistor according to the present embodiment includes the MIT device 100 connected to the base of the PNP transistor. The MIT device 100 is attached to a heating portion, for example, a surface of the power transistor 200 so as to operate according to a temperature of the power transistor 200.

In the MIT device 100, MIT occurs abruptly at a predetermined critical voltage, a critical temperature, etc. so that the MIT device 100 has characteristics of transition from an insulator to a metal, or vice versa. The MIT device 100 may be configured so as to be of a stack (vertical) type or a horizontal type.

In the stack type, a first electrode thin film, an MIT thin film where abrupt MIT occurs at a critical voltage, a critical temperature, etc., and a second electrode thin film are sequentially formed on a substrate. In the horizontal type, an MIT thin film is formed on a substrate, and first and second electrode thin films are disposed at both sides of the MIT thin film. If necessary, a buffer layer may be formed on a substrate in order to reduce a lattice mismatch between the substrate and the first thin film or the MIT thin film. The MIT thin film of the MIT device 100 may be formed of $VO_2$, ceramics or a single crystal.

The temperature characteristics of the MIT device 100 will be described in more detail with reference to graphs of FIGS. 2 and 3. An operation of controlling heat generation of the power transistor 200 via the MIT device 100 will now be described.

The emitter of the power transistor 200 is connected to the power source Vcc via a first resistance 250. The base of the power transistor 200 is connected to the power source Vcc via a second resistor 150. The resistances of the first and second resistors 250 and 150 are appropriately regulated according to the power source Vcc in order to correctly operate the power transistor 200 and control power supplied to the driving device 300.

In the circuit for controlling heat generation of a power transistor according to the present embodiment, the MIT device 100 is connected to the base of the power transistor 200. At ordinary times, that is, when the power transistor 200 does not radiate heat, since a base voltage is greater than a collector voltage connected to the driving device 300, the power transistor 200 is turned on, thereby supplying the power to the driving device 300.

When the power transistor 200 radiates heat, the temperature of the power transistor 200 may increase to a predetermined critical temperature. If it reaches the predetermined critical temperature, the MIT device 100 transits to a metal, and thus the base voltage changes to almost 0 V. Accordingly, the base voltage is smaller than the collector voltage, and the power transistor 200 is turned off, thereby shutting off the power supplied to the driving device 300. Since the power, i.e. the flow of current is shut off, the power transistor 200 stops radiating heat and thus cools.

When the power transistor 200 is cooled below a predetermined temperature, the MIT device 100 is transited back to an insulator, and the power transistor 200 is turned on, thereby normally supplying the power to the driving device 300.

By virtue of the MIT device 100 having MIT characteristics dependent on a temperature thereof, the heat generation of the power transistor 200 can be semi-permanently controlled without requiring the MIT device 100 to be changed, unlike in the case of a fuse. Thus, a system or all devices including the driving device 300, connected to the power transistor 200, can be safely protected.

In the present embodiment, the PNP junction transistor is exemplified as the power transistor 200, but the present invention is not limited thereto. For example, using an MIT device 100, in case of an NPN junction transistor, an N-type or P-type metal oxide semiconductor (MOS) transistor, or an N-type or P-type complementary metal oxide semiconductor (CMOS) transistor heat generation can be controlled. In the case of a MOS transistor, the MIT device may be connected to a gate region. In addition, a ground is connected to a terminal of the MIT device. If necessary, other surrounding circuits may be connected to the terminal of the MIT device, and may be connected between a base terminal and the MIT device.

A junction transistor and a MOS transistor are exemplified, but a photo diode, a photo transistor, a photo relay, a photo silicon controlled rectifier (SCR), etc., using light input to a base terminal thereof, may be used. In addition, an insulated gate bipolar transistor (IGBT), a SCR, a triac, etc. may be used.

Figure 2:
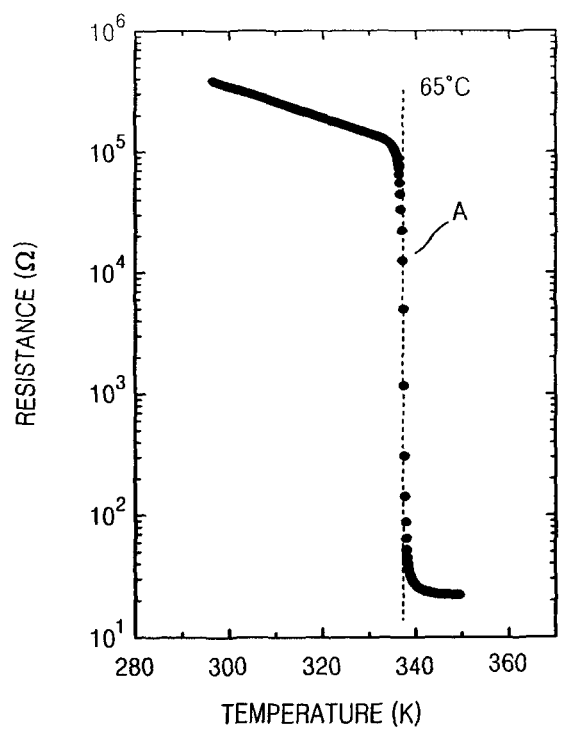
FIG. 2 is a graph illustrating resistance variation of an MIT device formed of vanadium dioxide $VO_2$ with respect to a temperature of the MIT device.

FIG. 2 is a graph illustrating resistance variation of an MIT device formed of vanadium dioxide $VO_2$ with respect to a temperature of the MIT device.

Referring to FIG. 2, the horizontal axis is an absolute temperature in units of K, and the vertical axis is resistance in units of ohms $\Omega$. The MIT device has high resistance equal to great than $10^5 \Omega$ at an absolute temperature equal to or less than 338 K, which represents the characteristics of an insulator. However, the resistance of the MIT device abruptly reduces at about 338 K, that is, about 65° C. (i.e. 'A'), and thus the MIT device obtains characteristics of a metal having resistance of several tens of $\Omega$. As described with reference to FIG. 1, since abrupt MIT occurs at about 65° C. in the MIT device, the resistance of the MIT device is abruptly reduced. Thus, it can be seen that the critical temperature of the MIT device used in this experiment is about 65° C.

The abrupt MIT occurs at 65° C. in the MIT device formed of $VO_2$. However, by doping with an appropriate material, the critical temperature of the MIT device can be changed. In addition, the critical temperature can be changed by changing the materials or structures of constituent elements of the MIT device. Likewise, using such MIT device in which the abrupt MIT occurs at the critical temperature, the circuit diagram of a circuit of controlling heat generation of power transistor, illustrated in FIG. 1, can be configured.

Figure 3:
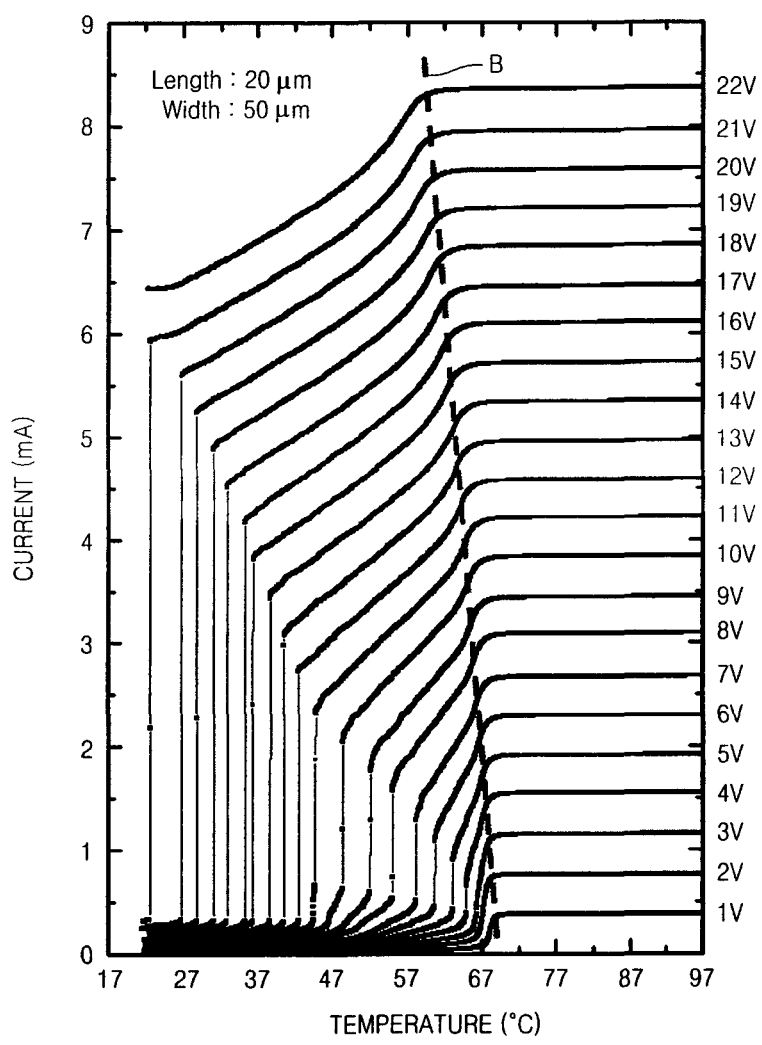
FIG. 3 is a graph illustrating a current measured while applying a voltage to an MIT device formed of $VO_2$ with respect to a temperature of the MIT device.

FIG. 3 is a graph illustrating a current measured while applying a voltage to an MIT device formed of $VO_2$ with respect to a temperature of the MIT device.

Referring to FIG. 3, when a voltage of 1 V is applied to the MIT device, a plot shows a typical current curve of $VO_2$. That is, the plot of the graph of FIG. 2 converted in terms of resistance with respect to temperature. In addition, it can be seen that the greater the voltage, the smaller a critical temperature of the MIT device, at which abrupt MIT occurs.

As the applied voltage is close to a critical voltage (i.e., 21.5 V) at which the abrupt MIT occurs, the critical temperature is close to room temperature. When a voltage of 22V is applied to the MIT device, only Ohm's law applies to the device, and there is no critical temperature. That is, when a voltage equal to or great than the critical voltage is applied to the MIT device, temperature change does not induce the abrupt MIT any more.

In addition, at a temperature equal to or greater than the critical temperature dependent on the applied voltage, it can be seen that the current varies according to Ohm's law, after the current jump. At about 68° C. (i.e., the vicinity of 'B'), as the voltage is increased, current variation is reduced, which represents that the structure of $VO_2$ constituting the MIT device is changed from an orthorhombic system to a tetragonal system. This is because that structural phase transition of $VO_2$, in which structure of $VO_2$ is changed from an orthorhombic system to a tetragonal system, occurs at about 68° C., and accordingly, MIT (not abrupt MIT) occurs, thereby generating electrical resistance variation. These characteristics are different from MIT characteristics dependent on the critical temperature, illustrated in FIG. 2. That is, in the MIT characteristics dependent on the critical temperature, structural phase transition does not occur, which is disclosed in other previous patent applications regarding MIT devices.

According to the present invention, an MIT device used in a circuit of controlling heat generation of power transistor, by changing a voltage applied to the MIT device, the critical temperature can be changed. With the MIT device having a variable critical temperature, the temperature of the power transistor can be freely set and controlled.

The voltage applied to the MIT device can be varied using a simple method in which variable resistors are connected to the MIT device in series. For example, in the circuit for controlling heat generation of a power transistor of FIG. 1, by using the second resistor 150 as the variable resistor, the voltage applied to the MIT device 200 can be controlled. The resistance of the second resistor 150 may be set according to the voltage applied to the MIT device 200 and the base voltage of the power transistor 200.

Figure 4A:
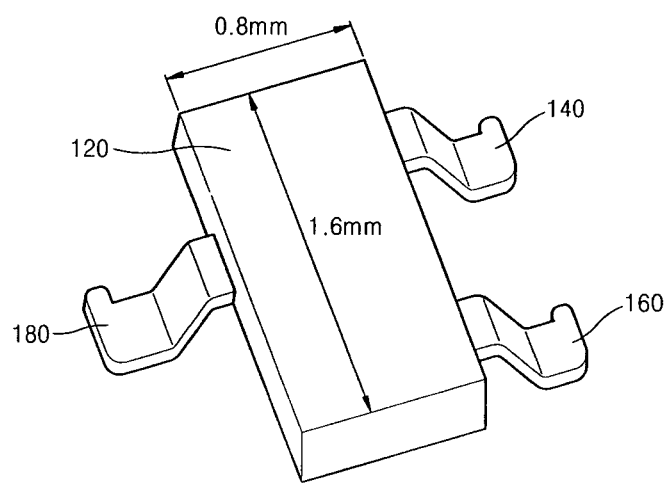
FIG. 4A is a perspective view of an MIT device packaged in a dual in-line package (DIP), according to an embodiment of the present invention.

FIG. 4A is a perspective view of an MIT device 100 packaged in a dual in-line package (DIP), according to an embodiment of the present invention.

Referring to FIG. 4A, the MIT device 100 is packaged in DIP. In this regard, DIP is a package form in which constituent elements of the MIT device 100 (e.g., a substrate and first and second electrode thin films) are sealed by a sealing member. In the case of DIP, external electrode terminals 140 and 160 may be formed in order to connect the first and second electrode thin films to external electrodes. In addition, an external heating terminal 180 connected to an MIT thin film may be formed in order for the MIT thin film to detect the temperature of the power transistor 200. A reference number 120 represents a packaged MIT device sealed by the sealed member.

As illustrated in FIG. 4A, the packaged MIT device 120 may be embodied in a small size, for example, a size having a vertical side of 1.6 mm and a horizontal side of 0.8 mm, but the present invention is not limited thereto. That is, according to the use of the packaged MIT device 120, the packaged MIT device 120 may be embodied in a smaller or larger size than in the case of FIG. 4A.

Figure 4B:
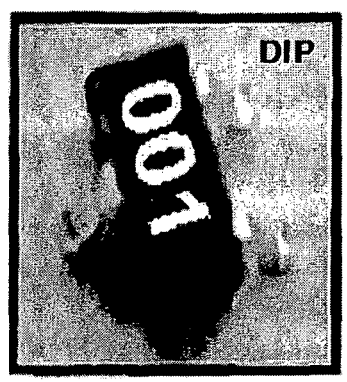
FIG. 4B is an image of the MIT device packaged in DIP, as illustrated in FIG. 4A.
Figure 4C:
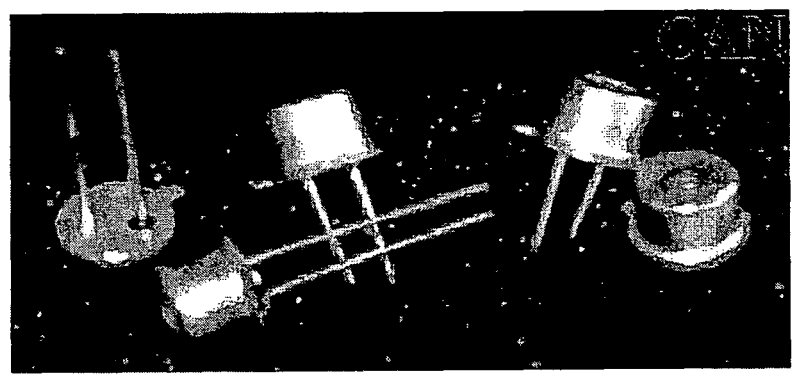
FIG. 4C is an image of the MIT device packaged in a CAN type.

FIGS. 4B and 4C are images of products of MIT devices packaged in DIP and a CAN type, respectively.

FIG. 4B is an image of the MIT device 120 packaged in DIP, as illustrated in FIG. 4A. FIG. 4C is an image of the MIT device packaged in the CAN type. Since the case of DIP has been described with reference to FIG. 4A, its description will not be repeated. The MIT device packaged in the CAN type package is sealed so that a portion of an MIT thin film is exposed to the outside. In this case, a lens condensing light may be formed on the exposed portion of the MIT thin film.

In the CAN type MIT device, the exposed portion of the MIT thin film detects temperature through electromagnetic waves, for example, heat rays such as infrared rays. When the detected temperature is equal to or greater than a critical temperature, MIT occurs in the MIT thin film. Accordingly, the external heating terminal 180 of DIP of FIG. 4B may not be required. In FIG. 4C, a set of two projected pins corresponds to the external electrode terminals 140 and 160 illustrated in FIG. 4B.

Figure 5:
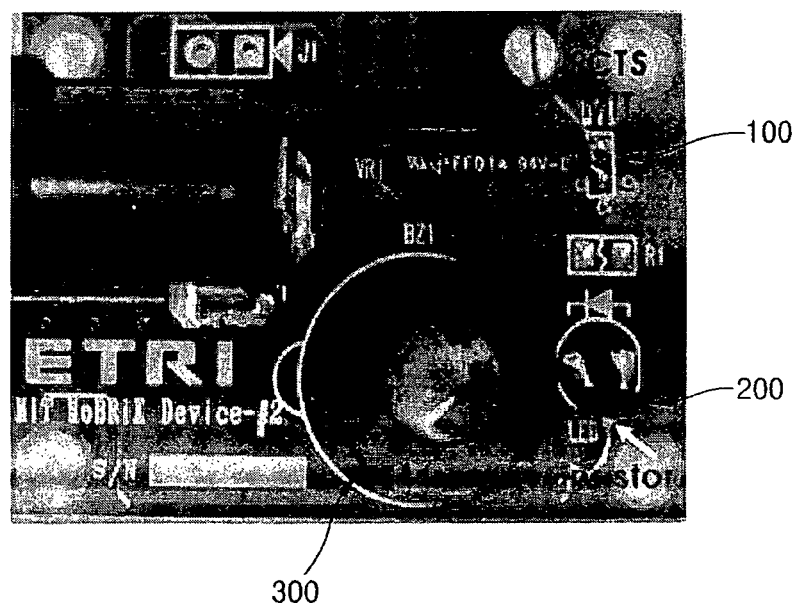
FIG. 5 is an image of a test board for checking the circuit of controlling heat generation of power transistor of FIG. 1.

FIG. 5 is an image of a test board for checking the circuit for controlling heat generation of a power transistor of FIG. 1.

FIG. 5 illustrates the circuit for controlling heat generation of a power transistor of FIG. 1 embodied as a real product on a board substrate. A light emitting diode (LED) 300 is used as a driving device. 'PCTS' in the field of MIT devices is an abbreviation of programmable critical temperature switch, which represents that the critical temperature of the MIT device 100 can be controlled. This has been described when the variable resistor is described with reference to FIG. 3.

The MIT device 100 and a transistor may be designed as a single chip, or alternatively, may be integrated into a single package, which will be described with reference to FIG. 7.

Figure 6:
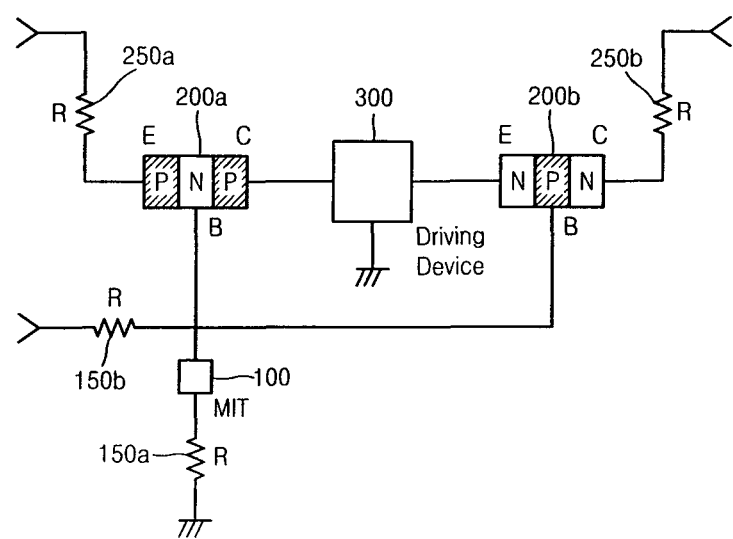
FIG. 6 is a circuit diagram of a circuit of controlling heat generation of power transistor using an MIT device, according to another embodiment of the present invention.

FIG. 6 is a circuit diagram of a circuit for controlling heat generation of a power transistor using an MIT device 100, according to another embodiment of the present invention.

Referring to FIG. 6, the circuit for controlling heat generation of a power transistor, which protects the driving device 300 by using two PNP and NPN junction transistors 200a and 200b, is illustrated. That is, the circuit for controlling heat generation of a power transistor includes the PNP and NPN junction transistors 200a and 200b connected to both sides of the driving device 300, and the MIT device 100 commonly connected to the PNP and NPN junction transistors 200a and 200b. Resistors 250a, 250b and 150b may be of the same function as in the case of FIG. 1. The resistor 150a is formed between the MIT device 100 and a ground in order to protect the MIT device 100, but the resistor 150a may be omitted.

Figure 7:
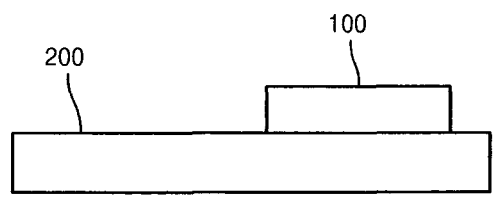
FIG. 7 is a cross-sectional view of a complex device including an MIT device and a transistor, which are configured as a single chip, according to an embodiment of the present invention.

FIG. 7 is a cross-sectional view of a complex device including an MIT device 100 and a transistor 200, which are configured as a single chip, according to an embodiment of the present invention.

Referring to FIG. 7, the MIT device 100 is formed on a silicon substrate or a sapphire substrate. When the MIT device 100 is formed on the silicon substrate, an MIT thin film is deposited on a $SiO_2$ thin film. Thus, when the transistor 200 and the MIT device 100 are integrated as the single chip, as illustrated in FIG. 7, a $SiO_2$ insulating layer (not shown) is formed between the transistor 200 and the MIT device 100. In addition, an electrode of the MIT device 100 and the transistor 200 are connected via a contact hole formed in the insulating layer.

In FIG. 6, the circuit for controlling heat generation of a power transistor is provided in order to continually supply stable power to the driving device 300. In FIG. 1, in the presence of heat generation, power is not supplied to the driving device 300 for a predetermined time by turning off the power transistor 200. However, power needs to continue to be provided to some electric or electronic devices without shutting off the power. Thus, the circuit for controlling heat generation of a power transistor is useful for such electric or electronic devices.

The circuit for controlling heat generation of a power transistor of FIG. 6 operates as follows. At ordinary times, since the MIT device 100 is in an insulator state, a current does not flow. In this case, since a base voltage of the PNP transistor 200a is greater than a collector voltage of the PNP transistor 200a, the PNP transistor 200a is turned on, and thus the PNP transistor 200a supplies power to the driving device 300. At this time, the NPN transistor 200b is turned off, thereby shutting off power.

The temperature of the PNP transistor 200a increases since the PNP transistor 200a supplies the power to the driving device 300. At this time, the MIT device 100 is transited to a metal state, and accordingly, the PNP transistor 200a is turned off, thereby shutting off the power to the driving device 300. However, a current is supplied toward a base of the NPN transistor 200b, and a base voltage of the NPN transistor 200b is reduced compared to a collector voltage of the NPN transistor 200b, the NPN transistor 200b is turned on, thereby supplying power the driving device 300.

Accordingly, even if power is shut off due to the heat generation of the PNP transistor 200a, the NPN transistor 200a operates to supply power to the driving device 300, and thus stable power can be continually supplied to the driving device 300.

When the PNP transistor 200a is again cooled, the MIT device 100 comes in an insulating state. At this case, the PNP transistor 200a operates, and the NPN transistor 200b does not operate. These occurrences are repeated.

Likewise, an MIT device can be used instead of a fuse, and a power transistor can semi-permanently maintain high reliability.

In FIG. 6, the PNP transistor 200a and the NPN transistor 200b are exemplified. Of course, N-type and P-type MOS transistors using an MIT device can prevent heat generation, and N-type and P-type MOS transistors may be used with CMOS structure. In addition, IGBT, a triac, SCR, etc., which are power devices, may be used as the PNP transistor 200a or the NPN transistor 200b.

Figure 8A:
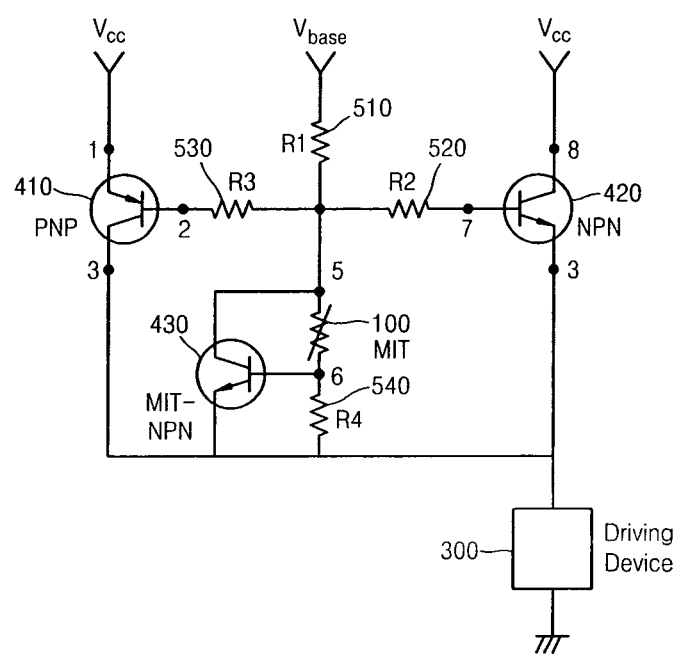
FIGS. 8A and 8B are circuit diagrams of a circuit of controlling heat generation of power transistor, according to another embodiment of the present invention.
Figure 8B:
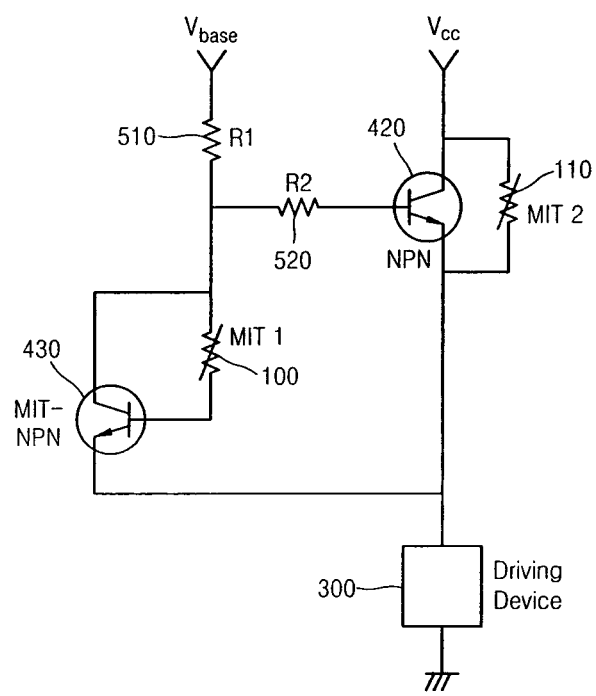

FIGS. 8A and 8B are circuit diagrams of a circuit for controlling heat generation of a power transistor, according to another embodiment of the present invention.

Referring to FIG. 8A, the circuit for controlling heat generation of a power transistor includes a MIT device 100, two power transistors 410 and 420, and an MIT transistor MIT-NPN 430 for controlling a current of the MIT device 100. The circuit will be described in more detail from a circuit point of view. The two power transistors, i.e., the PNP transistor 410 and the NPN transistor 420 are connected between power source Vcc for supplying power to the driving device 300 and a driving device 300 via a collector terminal respectively. In addition, base terminals of the PNP transistor 410 and the NPN transistor 420 are connected to the MIT device 100 via a resistor R2 520 and a resistor R3 530, respectively.

The MIT transistor MIT-NPN 430 of an NPN type is connected to the MIT device 100 in order to protect the MIT device 100. The MIT device 100 is connected between an emitter terminal and a base terminal of the MIT transistor 430, and is connected to the driving device 300 via a resistor R4 540. The base terminals of the PNP transistor 410 and the NPN transistor 420, and the MIT transistor 430 are connected to base power $V_{base}$ via a resistor R1.

As an experimental example of the circuit for controlling heat generation of a power transistor of FIG. 8A, the MIT device 100 formed of $VO_2$ is attached to a surface of the NPN transistor 420 (TIP 29C and maximum current 2 A) as a power transistor, R1=100Ω, R2=110Ω, R3=1KΩ, R4=0Ω, the PNP transistor 410 (TIP 32C and a maximum current 3 A), and the MIT transistor 430 (TIP 29C) are used.

The power source Vcc is 3.4 V and the base power $V_{base}$ is 4.9 V. At this time, initially, a base current of the NPN transistor 420 is about 6 mA, a base current of the PNP transistor 410 does not flow, and an entire current (i.e. about 0.8 A) supplied to the driving device 300 flows through the NPN transistor 420. Then, as the temperature of the NPN transistor 420 increases, the MIT device 100 operates so that MIT occurs from high resistance to low resistance, the base current of the NPN transistor 420 is reduced to about 3.86 mA, and the temperature of the PNP transistor 410 starts to increase. This represents that a current flows through the PNP transistor 410. At this time, the entire current supplied to the driving device 300 is about 0.52 A.

It can be seen that an emitter current of about 0.25 A flows through the NPN transistor 420 when shorting an emitter of the PNP transistor 410. This represents that a current of about 0.25 A also flows towards en emitter of the PNP transistor 410. At this time, a surface temperature of the NPN transistor 420 is 71° C., and a surface temperature of the PNP transistor 410 is 69° C. Switching off of the circuit for controlling heat generation of a power transistor of FIG. 8A can be confirmed using the NPN transistor connected to a base of the PNP transistor 410. That is, when an emitter and a collector of the NPN transistor are connected to the PNP transistor 410 and resistor R3 respectively, and a base of the NPN transistor is connected to the base power $V_{base}$, the switching off of the circuit of FIG. 8A can be confirmed using a pulse that repeatedly turns the base power $V_{base}$ on/off.

FIG. 8B illustrates another application of the circuit of FIG. 8A. The circuit of FIG. 8B is designed so that a power supplying MIT device 110 instead of the PNP transistor 410 illustrated in FIG. 8A is attached to the NPN transistor 420 and so that when a temperature of the NPN transistor 420 increases to a temperature equal to or greater than a critical temperature of the power supplying MIT device 110, the power supplying MIT device 110 operates. In more detail, due to the MIT device 100 attached to a base of the NPN transistor 420, a current of the NPN transistor 420 is reduced from about 0.5 A to about 0.25 A at a temperature equal to or greater than the critical temperature. In addition, a current of about 0.2 A flows to the power supplying MIT device 110 used instead of the PNP transistor 410 illustrated in FIG. 8A, and thus an entire current supplied through the driving device 300 is about 0.45 A. Since the power supplying MIT device 110 with, the resistance of which is lower than a transistor at a temperature equal to or greater than a critical temperature, is used instead of the PNP transistor 410, heat generation of a transistor can be efficiently reduced.

In the circuit for controlling heat generation of a power transistor, according to the present invention, with respect to the same current of 0.5 A, a surface temperature of NPN transistor 420 is reduced to 70° C. compared to the surface temperature of 140° C. in the case of the conventional circuit. Thus, an aluminum heat sink or a temperature fuse is not required. Although the circuit of controlling heat generation of power transistor is slightly complicated, the circuit can be simplified when manufacturing transistors into a single chip. In addition, a single packaged MIT+transistor complex device can be sufficiently miniaturized.

Figure 9A:
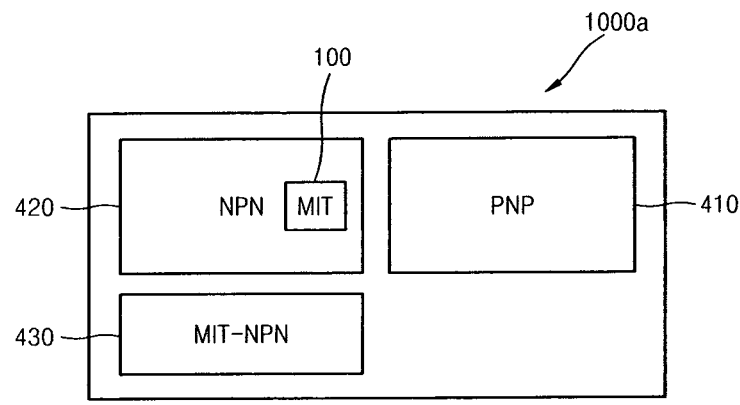
FIGS. 9A through 9D are structural views of arrangement relationship between transistors and a MIT device when a heating control circuit of FIG. 8A or 8B is configured as a single chip.
Figure 9B:
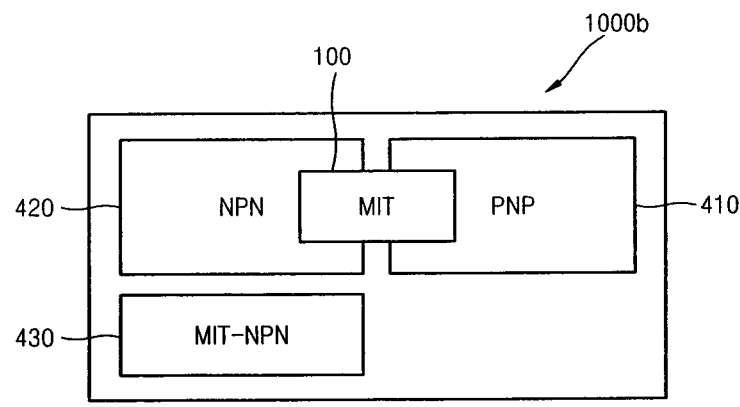
Figure 9C:
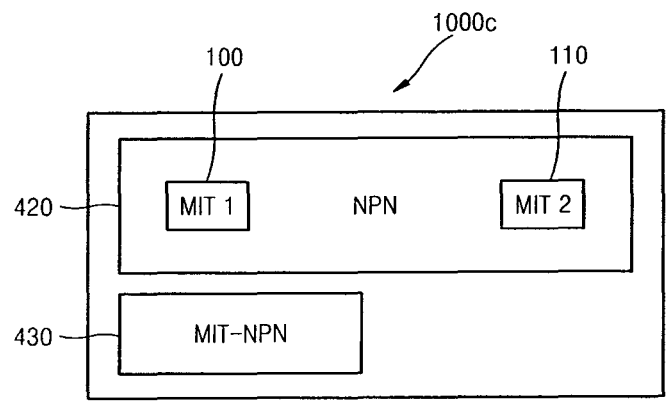
Figure 9D:
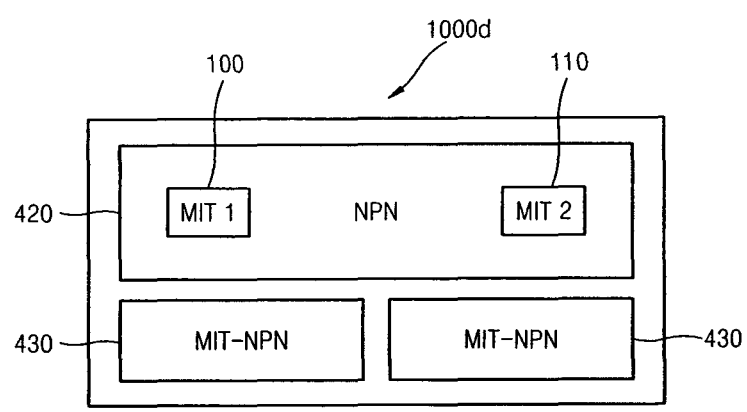

FIGS. 9A through 9D are structural views of arrangement relationship between transistors and a MIT device 100 when a heating control circuit of FIG. 8A or 8B is configured as a single chip. In more detail, FIGS. 9A and 9B illustrate the heating control circuit of FIG. 8A is configured as a single chip. FIGS. 9C and 9D illustrate the heating control circuit of FIG. 8B is configured as a single chip.

FIG. 9A illustrates arrangement where the MIT device 100 is disposed on the power NPN transistor 420 in a heating control circuit package 1000 where the heating control circuit is configured as a single chip. FIG. 9B illustrates arrangement where the MIT device 100 overlaps parts of the power NPN transistor 420 and the PNP transistor 410 in the heating control circuit package 1000a. In FIG. 9B, the MIT device 100 may control the power NPN transistor 420 and the PNP transistor 410 according to their temperatures, and may maintain the temperatures of the power NPN transistor 420 and the PNP transistor 410 as similar temperatures.

FIG. 9C illustrates a structure including a power supplying MIT device 110 instead of the PNP transistor 410 illustrated in FIG. 9A or 9B. FIG. 9D illustrates a structure further including an NPN transistor 430 (right part) protecting the MIT device 110.

Figure 10:
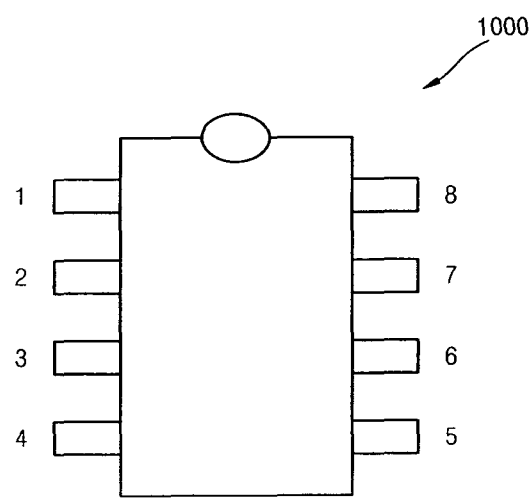
FIG. 10 is an arrangement view of chip pins of the case where the heating control circuit of FIG. 8A is configured as a single chip.

FIG. 10 is an arrangement view of chip pins of the case where the heating control circuit of FIG. 8A is configured as a single chip.

Terminals 1 through 8 indicated as spots in the heating control circuit of FIG. 8A may be connected to the chip pins 1 through 8 projected outside of the single chip, i.e., the heating control circuit package 1000 of FIG. 10, respectively. The numbers of the chip pins correspond to the numbers in the heating control circuit of FIG. 8A. However, the present invention is not limited thereto.

According to the above embodiments of the present invention, the circuit for controlling heat generation of a power transistor can be used in all electric-electronic circuit system using a power transistor, such as a cellular phone, a notebook computer, a cell charging circuit, a motor controlling circuit, a power controlling circuit and power supply of a electric-electronic device, a power amplifier including audio equipment, and an inner circuit of a integrated functional integrated circuit (IC) including a microprocessor.

According to the present invention, in the method and circuit for controlling heat generation of a transistor, an MIT device attached to a power transistor prevents the power transistor from wrongly operating due to an excessive increase in its temperature. Thus, all devices or system to which the power transistor supplies power can be protected.

Accordingly, the circuit for controlling heat generation of a power transistor can be used in all electric-electronic circuit system using a power transistor, such as a cellular phone, a notebook computer, a cell charging circuit, a motor controlling circuit, a power controlling circuit and power supply of a electric-electronic device, a power amplifier including audio equipment, and an inner circuit of a integrated functional integrated circuit (IC).

In addition, since the MIT device can be semi-permanently used without requiring the MIT device to be changed or replaced, the problem with time to replace or costs incurred due to replacement can be overcome.

While the present invention has been particularly shown and described with reference to exemplary embodiments thereof, it will be understood by those of ordinary skill in the art that various changes in form and details may be made therein without departing from the spirit and scope of the present invention as defined by the following claims.

MODE FOR INVENTION

Industrial Applicability

The present invention relates to a metal-insulator transition (MIT) device, and more particularly, to a method and circuit for controlling heat generation of a power transistor using an MIT device. According to the present invention, in the method and circuit for controlling heat generation of a transistor, an MIT device attached to a power transistor prevents the power transistor from wrongly operating due to an excessive increase in its temperature. Thus, all devices or system to which the power transistor supplies power can be protected.

The invention claimed is:
1. A circuit for controlling heat generation of a transistor, the circuit comprising:
   a metal-insulator transition (MIT) device in which abrupt MIT occurs at a predetermined critical temperature; and
   a power transistor connected to a driving device and controlling power-supply to the driving device,
   wherein the MIT device is attached to a heating surface or heating portion of the transistor and is connected to a base terminal or gate terminal of the transistor or a surrounding circuit from a circuit point of view,
   wherein when a temperature of the transistor increases to a temperature equal to or greater than the predetermined critical temperature, the MIT device reduces or shuts off a current of the transistor so as to prevent heat generation, wherein the MIT device comprises an MIT thin film where abrupt MIT occurs at the critical temperature, and at least two electrode thin films in contact with the MIT thin film, wherein the MIT device is a stack type in which the at least two electrode thin films are disposed between the MIT thin film, or a horizontal type in which the at least two electrode thin films disposed at both sides of the MIT thin film, and wherein the MIT device is packaged in a dual in-line package (DIP) type in which the MIT thin film and the at least two electrode thin films are sealed by a sealing member, or is packaged in a CAN type in which a predetermined portion of the MIT thin film is exposed.

2. The circuit for controlling heat generation of a transistor of claim 1, wherein the translator is an NPN or PNP junction transistor.

3. The circuit for controlling heat generation of a transistor of claim 1, wherein the translator is a metal oxide semiconductor (MOS) transistor.

4. The circuit for controlling heat generation of a transistor of claim 1, wherein the translator comprises any one of a photo diode (or photo transistor), photo relay and photo silicon controlled rectifier (SCR) using light input to the base terminal.

5. The circuit for controlling heat generation of a transistor of claim 1, wherein the transistor comprises any one of an insulated gate bipolar transistor (IGBT), an SCR and a triac.

6. The circuit for controlling heat generation of a transistor of claim 1, wherein the MIT device is a DIP type MIT device, wherein the DIP type MIT device comprises two external electrodes connected to the at least two electrode thin films and an external heating terminal detecting heat generation of the driving device and connected to the MIT thin film.

7. The circuit for controlling heat generation of a transistor of claim 1, wherein the MIT device is a CAN type MIT device, wherein the CAN type MIT device includes two external electrode terminals connected to the at least two electrode thin films and detects heat generation of the driving device through infrared rays input through the predetermined portion that is exposed.

8. The circuit for controlling heat generation of a transistor of claim 1, wherein the MIT device is manufactured of a thin film, ceramic or a single crystal.

9. The circuit for controlling heat generation of a transistor of claim 1, wherein the MIT device is formed of $VO_2$.

10. The circuit for controlling heat generation of a transistor of claim 1, wherein the MIT device and the transistor are designed as a single chip.

11. The circuit for controlling heat generation of a transistor of claim 10, wherein the single chip has a structure in which the MIT device is disposed on the transistor.

12. The circuit for controlling heat generation of a transistor of claim 11, wherein the MIT device is disposed on an insulating layer formed on the transistor, wherein an electrode of the MIT device and an electrode of the transistor are connected to each other via a contact hole formed in the insulating layer.

13. The circuit for controlling heat generation of a transistor of claim 1, wherein the MIT device and the transistor are integrated and used in a single package.

14. The circuit for controlling heat generation of a transistor of claim 1, wherein the critical temperature varies according to a voltage applied to the MIT device.

15. An electric-electronic circuit system comprising the circuit for controlling heat generation of a transistor of claim 1.

16. The electric-electronic circuit system of claim 15, further comprising a cellular phone, a computer, a cell charger, a motor controller, a power amplifier including audio equipment, a power controlling circuit and power supply of an electric-electronic device and an inner circuit of a integrated functional integrated circuit (IC) including a microprocessor.

17. A circuit for controlling heat generation of a transistor, the circuit comprising:
an MIT device in which abrupt MIT occurs at a predetermined critical temperature; and
two power transistors connected to both sides of a driving device and controlling power-supply to the driving device,
wherein the MIT device is attached to a heating surface or heating portion of at least one of the two power transistors and is connected to a base terminal or gate terminal of each of the two power transistors from a circuit point of view, and
wherein when a temperature of a first transistor of the two power transistors increases to a temperature equal to or greater than the predetermined critical temperature, the MIT device shuts off a current of the first transistor and allows a current to flow through a second transistor of the two power transistors so as to prevent heat generation of the two power transistors.

18. The circuit for controlling heat generation of a transistor of claim 17, wherein one of the two power transistor is an NPN junction transistor and the other of the two power transistors is a PNP junction transistor.

19. The circuit for controlling heat generation of a transistor of claim 17, wherein one of the two power transistors is an N-type MOS transistor and the other of the two power transistors is a P-type MOs transistor, wherein the N-type and P-type MOS transistors are separately formed or integrated as a complementary metal oxide semiconductor (CMOS) transistor.

20. The circuit for controlling heat generation of a transistor of claim 17, wherein the MIT device comprises an MIT thin film where abrupt MIT occurs at the predetermined critical temperature and at least two electrode thin films in contact with the MIT thin film, and
wherein the MIT device is a stack type in which the at least two electrode thin films are vertically staked at both sides of the MIT thin film, or a horizontal type in which the at least two electrode thin films are disposed at both ends of the MIT thin film.

21. The circuit for controlling heat generation of a transistor of claim 20, wherein the MIT device is packaged in a dual in-line package (DIP) type in which the MIT thin film and the at least two electrode thin films are sealed by a sealing member, or is packaged in a CAN type in which a predetermined portion of the MIT thin film is exposed.

22. The circuit for controlling heat generation of a transistor of claim 17, wherein the MIT device is manufactured of a thin film, ceramic or a single crystal.

23. The circuit for controlling heat generation of a transistor of claim 17, wherein the MIT device is formed of $VO_2$.

24. The circuit for controlling heat generation of a transistor of claim 17, wherein the MIT device and the transistor are designed as a single chip.

25. The circuit for controlling heat generation of a transistor of claim 24, wherein the single chip has a structure in which the MIT device is disposed on any one of the two power transistors.

26. The circuit for controlling heat generation of a transistor of claim 24, wherein the single chip has a structure in which the MIT device is commonly disposed on the two power transistors.

27. The circuit for controlling heat generation of a transistor of claim 17, wherein the MIT device and the two power transistors are integrated and used in a single package.

28. The circuit for controlling heat generation of a transistor of claim 27, wherein each of the two transistors comprises any one of a photo diode, photo transistor, photo relay or photo silicon controlled rectifier (SCR) using light input to the base terminal.

29. A circuit for controlling heat generation of a transistor, the circuit comprising:
   an MIT device in which abrupt MIT occurs at a predetermined critical temperature;
   two power transistors connected to both sides of a driving device and controlling power-supply to the driving device; and
   a transistor for protecting the MIT device, controlling a current of the MIT device and supplying power towards the driving device,
   wherein the MIT device is attached to a heating surface or heating portion of at least one of the two power transistors and is connected to a base terminal or gate terminal of each of the two power transistors from a circuit point of view, and
   wherein when a temperature of the two transistors increases to a temperature equal to or greater than the predetermined critical temperature, the MIT device controls a current supplied to the two transistors so as to control heat generation of the two transistors.

30. The circuit for controlling heat generation of a transistor of claim 29, wherein one of the two power transistor is an NPN junction transistor and the other of the two power transistors is a PNP junction transistor.

31. The circuit for controlling heat generation of a transistor of claim 30, wherein when a temperature of a first transistor of the two transistors increases to a temperature equal to or greater than the critical temperature, the MIT device shuts or reduces a current of the first transistor and allows a current to flow through a second transistor of the two power transistor so as to prevent heat generation of the two power transistors.

32. The circuit for controlling heat generation of a transistor of claim 31, wherein when the second transistor operates so as to repeatedly turn the driving device on/off, another transistor controlling the second transistor is attached to a base of the second transistor.

33. A circuit for controlling heat generation of a transistor, the circuit comprising:
   a power transistor connected to a driving device and controlling power-supply to the driving device;
   a first MIT device connected to a base terminal or gate terminal of the transistor or a surrounding circuit, where abrupt MIT occurs at a predetermined critical temperature;
   a second MIT device connected between a collector terminal and emitter terminal of the transistor, or between a source terminal and drain terminal of the transistor,
   wherein abrupt MIT occurs at the critical temperature, wherein the first and second MIT devices are attached to a heating surface or heating portions of the transistor, wherein when a temperature of the transistor increases to the critical temperature, the first and second devices operate so as to control a current supplied to the transistor and prevent heat generation of the transistor.

34. The circuit for controlling heat generation of a transistor of claim 33, wherein a transistor protecting any one of the MIT devices is attached thereto.

\* \* \* \* \*